United States Patent
Cohen

(10) Patent No.: US 10,261,155 B2
(45) Date of Patent: Apr. 16, 2019

(54) SYSTEMS AND METHODS FOR ACCELERATION MAGNETIC RESONANCE FINGERPRINTING

(71) Applicant: THE GENERAL HOSPITAL CORPORATION, Boston, MA (US)

(72) Inventor: Ouri Cohen, Brookline, MA (US)

(73) Assignee: The General Hospital Corporation, Boston, MA (US)

( * ) Notice: Subject to any disclaimer, the term of this patent is extended or adjusted under 35 U.S.C. 154(b) by 215 days.

(21) Appl. No.: 15/117,337

(22) PCT Filed: Jan. 29, 2015

(86) PCT No.: PCT/US2015/013497
§ 371 (c)(1),
(2) Date: Aug. 8, 2016

(87) PCT Pub. No.: WO2015/175028
PCT Pub. Date: Nov. 19, 2015

(65) Prior Publication Data
US 2016/0349342 A1  Dec. 1, 2016

Related U.S. Application Data

(60) Provisional application No. 61/938,300, filed on Feb. 11, 2014, provisional application No. 61/973,304, filed on Apr. 1, 2014, provisional application No. 62/026,369, filed on Jul. 18, 2014.

(51) Int. Cl.
*G01R 33/561* (2006.01)
*G01R 33/54* (2006.01)
*G01R 33/48* (2006.01)

(52) U.S. Cl.
CPC ....... *G01R 33/5616* (2013.01); *G01R 33/482* (2013.01); *G01R 33/543* (2013.01); *G01R 33/5618* (2013.01)

(58) Field of Classification Search
CPC ................. G01R 33/482; G01R 33/543; G01R 33/5616; G01R 33/5618; A61B 5/055
See application file for complete search history.

(56) References Cited

U.S. PATENT DOCUMENTS 6,700,374 B1 *  3/2004  Wu ................. G01R 33/56554
                                                           324/306
7,337,205 B2    2/2008  Sazegar
7,772,844 B2    8/2010  Hurd
(Continued)

OTHER PUBLICATIONS

International Search Report and Written Opinion dated Oct. 1, 2015 in connection with PCT/US2015/013497.
(Continued)

*Primary Examiner* — Minh N Tang
(74) *Attorney, Agent, or Firm* — Quarles & Brady LLP

(57) ABSTRACT

Systems and methods for accelerating magnetic resonance fingerprinting ("MRF"} acquisitions are described. Acquisition parameters can be optimized to reduce the number of acquisitions necessary while maximizing the discrimination between the physical parameters to be estimated. The systems and methods may also include implementing pulse sequences that rapidly acquire large volumes of k-space data, including echo-planar imaging ("EPI"} and segmented EPI sequences.

19 Claims, 4 Drawing Sheets

(56) References Cited

U.S. PATENT DOCUMENTS

| | | |
|---|---|---|
| 7,945,305 B2 | 5/2011 | Aggarwal et al. |
| 8,723,518 B2 * | 5/2014 | Seiberlich ............ G01R 33/543 |
| | | 324/307 |
| 2012/0235678 A1 | 9/2012 | Seiberlich et al. |

OTHER PUBLICATIONS

Labadie, et al., Rapid Metabolite Mapping with "Exocycled SCEPSIS". Max Plank Institute Research Report 2010/2011, p. 255. [retrieved on Sep. 7, 2015]. Retrieved from the internet: URL:http://www.psy.uni-muenster.de/imperla/md/content/psychologie_institut_2/ae_lappe/freie_documente/rr)2010-2011.pdf; p. 255.

* cited by examiner

SYSTEMS AND METHODS FOR ACCELERATION MAGNETIC RESONANCE FINGERPRINTING

CROSS-REFERENCE TO RELATED APPLICATIONS

This application is a 371 application of PCT/US2015/013497 Filed Jan. 29, 2015, which claims priority to U.S. Provisional Application Ser. No. 61/938,300, filed on Feb. 11, 2014, and U.S. Provisional Application Ser. No. 61/973,304 filed Apr. 1, 2014, and U.S. Provisional Application Ser. No. 62/026,369, filed Jul. 18, 2014, the disclosures of which are incorporated by reference herein for all purposes.

STATEMENT REGARDING FEDERALLY SPONSORED RESEARCH

This invention was made with government support under W81XWH-09-2-001 awarded by the Department of Defense. The government has certain rights in the invention.

BACKGROUND

The present disclosure relates to systems and methods for magnetic resonance imaging ("MRI"). More particularly, systems and methods are described for accelerating data acquisitions used in magnetic resonance fingerprinting applications.

Magnetic resonance fingerprinting ("MRF") is an imaging technique that enables quantitative mapping of tissue or other material properties based on random or pseudorandom measurements of the subject or object being imaged. Examples of parameters that can be mapped include longitudinal relaxation time, $T_1$; transverse relaxation time, $T_2$; main magnetic field map, $B_0$; and proton density, $\rho$. MRF is generally described in U.S. Pat. No. 8,723,518, which is herein incorporated by reference in its entirety.

The random or pseudorandom measurements obtained in MRF techniques are achieved by varying the acquisition parameters from one repetition time ("TR") period to the next, which creates a time series of images with varying contrast. Examples of acquisition parameters that can be varied include flip angle, radio frequency ("RF") pulse phase, TR, echo time ("TE"), and sampling patterns, such as by modifying one or more readout encoding gradients.

The data acquired with MRF techniques are compared with a dictionary of signal models, or templates, that have been generated for different acquisition parameters from magnetic resonance signal models, such as Bloch equation-based physics simulations. This comparison allows estimation of the desired physical parameters, such as those mentioned above. The parameters for the tissue or other material in a given voxel are estimated to be the values that provide the best signal template matching.

Often, a slice-selective, highly undersampled spiral k-space acquisition is utilized for two-dimensional MRF acquisitions, where in many instances, the spiral trajectory is changed from one time point (e.g., TR period) to the next. To enable accurate parameter estimation, for each imaging slice upwards of 1000-2000 time points are acquired with a TR that is typically about 10 milliseconds. This results in an acquisition time of around 10-20 seconds per imaging slice. To create high-resolution volumetric parameter maps with 1 mm slice thickness, approximately 120 imaging slices will have to be imaged, resulting in a total acquisition time of 20-40 minutes. This acquisition time is quite lengthy and limits the widespread clinical usage of MRF techniques.

Given the above, there remains a need for improved an MRF acquisition techniques.

SUMMARY

The present disclosure overcomes the aforementioned drawbacks by providing a system and method for estimating quantitative parameters of a subject using a magnetic resonance imaging ("MRI") system, which includes estimating acquisition parameters that are optimized to direct an MRI system to generate a plurality of different signal evolutions that maximize discrimination between different quantitative parameters in a minimized number of repetition time ("TR") periods. The method includes acquiring data with the MRI system by directing the MRI system to perform a plurality of pulse sequences using the optimized acquisition parameters, the acquired data representing the plurality of different signal evolutions that maximize discrimination between different quantitative parameters. Quantitative parameters of the subject are then estimated by comparing the acquired data with a dictionary database comprising a plurality of different signal templates.

In accordance with one aspect of the present disclosure, a method is provided for estimating quantitative parameters of a subject using an MRI system, in which data is acquired with the MRI system by directing the MRI system to perform an echo-planar imaging (EPI) pulse sequence that samples k-space in satisfaction of a Nyquist criterion during each of a plurality of different repetition time (TR) periods. The acquired data represents a plurality of different signal evolutions acquired using different acquisition parameter settings in each TR period. Quantitative parameters of the subject are then estimated by comparing the acquired data with a dictionary database comprising a plurality of different signal templates.

In accordance with another aspect of the present disclosure, a magnetic resonance imaging (MRI) system is provided that includes a magnet system configured to generate a polarizing magnetic field about at least a portion of a subject arranged in the MRI system and a magnetic gradient system including a plurality of magnetic gradient coils configured to apply at least one magnetic gradient field to the polarizing magnetic field. The MRI system also includes a radio frequency (RF) system configured to apply an RF field to the subject and to receive magnetic resonance signals from the subject using a coil array and a computer system. The computer system is programmed to estimate acquisition parameters to generate a plurality of different signal evolutions that achieve a desired discrimination between different quantitative parameters in a desired number of repetition time (TR) periods. The computer system is also configured to control the magnetic gradient system and the RF system to acquire data using the estimated acquisition parameters, the data representing the plurality of different signal evolutions that achieve a desired discrimination between different quantitative parameters. The computer system is further configured to estimate quantitative parameters of the subject by comparing the acquired data with a dictionary database comprising a plurality of different signal templates.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full

DETAILED DESCRIPTION

Figure 1:
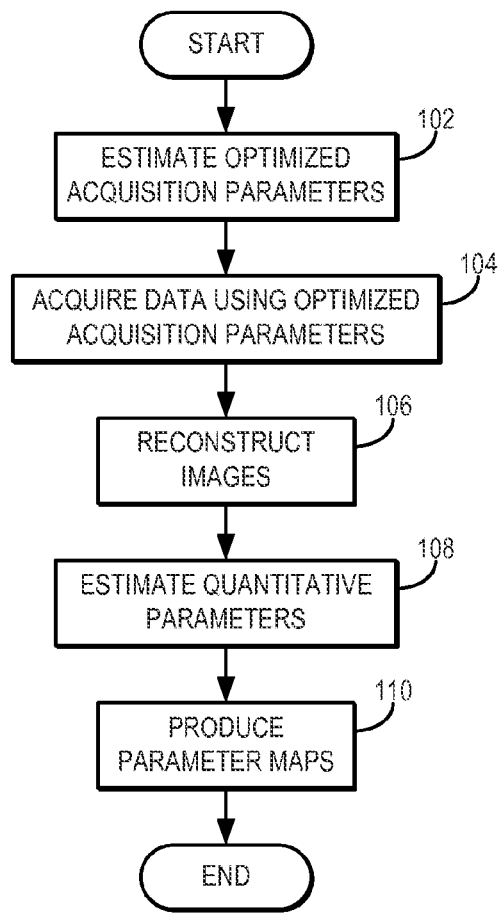
FIG. 1 is a flowchart setting forth the steps of an example of one method for estimating quantitative parameters from data acquired using acquisition parameters that have been optimized to reduce the number of acquisitions necessary to maximize the discrimination between the quantitative parameters to be estimated in an MRF application.

Described here are systems and methods for accelerating magnetic resonance fingerprinting ("MRF") acquisitions by selecting acquisition parameters that reduce the number of acquisitions necessary, while increase the discrimination between the physical parameters to be estimated. The systems and methods may also include implementing pulse sequences that rapidly acquire large volumes of k-space data, including echo-planar imaging ("EPI") and segmented EPI sequences.

In general, MRF techniques utilize a data acquisition scheme that causes signals from different materials or tissues to be spatially and temporally incoherent by continuously varying acquisition parameters throughout the data acquisition process. Examples of acquisition parameters that can be varied include flip angle ("FA"), radio frequency ("RF") pulse phase, repetition time ("TR"), echo time ("TE"), and sampling patterns, such as by modifying readout encoding gradients. In typical MRF approaches, the acquisition parameters are generally varied in a pseudorandom manner.

As a result of the spatial and temporal incoherence imparted by an acquisition scheme utilizing multiple parameter values, each material or tissue is associated with a unique signal evolution or "fingerprint," that is a function of multiple different physical parameters, including longitudinal relaxation time, $T_1$; transverse relaxation time, $T_2$; main magnetic field map, $B_0$; and proton density, $\rho$.

Quantitative parameter maps are then generated from the acquired signals based on a comparison of the signals to a predefined dictionary of predicted signal evolutions. Each of these dictionaries is associated with different combinations of materials and acquisition parameters. As an example, the comparison of the acquired signals to a dictionary can be performed using any suitable matching or pattern recognition technique. This comparison results in the selection of a signal vector, which may constitute a weighted combination of signal vectors, from the dictionary that best correspond to the observed signal evolution. The selected signal vector includes values for multiple different quantitative parameters, which can be extracted from the selected signal vector and used to generate the relevant quantitative parameter maps.

To uniquely distinguish between various different tissue parameters, current implementations of MRF generally require a large number of acquisitions (e.g., greater than 1000) for each phase encoding line. As a result, the generation of a suitable dictionary, and the subsequent matching process, requires significant computational resources and processing time. The large number of acquisitions needed for conventional MRF applications also results in an increased specific absorption rate ("SAR") and long scan times. To avoid excessive scan times, current MRF acquisition techniques commonly include undersampling k-space, which leads to appreciable errors and increased image artifacts.

It is an aspect of the present disclosure to provides a system and method for selecting acquisition parameters that reduce the total number of acquisitions needed to sufficiently sample the physical parameter space in a manner that increases the discrimination between different parameters, thereby reducing the scan time required to perform MRF. Additional time savings can be achieved by using rapid data acquisition schemes, such as EPI and segmented EPI. For instance, the systems and methods described here provide an optimization technique to select acquisition parameters that allow the use of fewer acquisitions (e.g., upwards of a 100-fold reduction) without affecting image quality.

In some configurations, which will be described below, the technique can also include fully sampling k-space, contrary to existing MRF acquisitions. For instance, an MRF acquisition can be accelerated by using an EPI data acquisition scheme. Using EPI, k-space can be fully sampled in a single TR, contrary to existing MRF acquisitions, which typically acquire only a single spoke of k-space during each TR. Even though an EPI acquisition is comparatively quick, more signal evolutions occurs during an EPI acquisition than during conventional MRF acquisitions. It is a discovery of the present work that these additional signal evolutions do not significantly compromise the matching of acquired data to a dictionary. As such, the benefits of rapidly and fully sampling k-space can be achieved in MRF applications.

As will now be described in more detail, the systems and methods of the present work provide accelerated and optimized MRF acquisitions. In some configurations, full k-space data may be acquired during each TR of an EPI pulse sequence following a variable flip angle excitation pulse. Each subsequent TR, flip angle, or other suitable acquisition parameter can then varied from one excitation to the next in accordance with a strategy that improves or optimizes the acquisition parameters to thereby improve the discrimination between quantitative parameters, while reducing the total number of acquisitions.

In contrast to previous methodologies, the approach presented herein controls time delays associated with requirements that subsequent phase-encoding k-space lines begin from thermal equilibrium. In addition, a significant reduction in undersampling and motion artifacts can be achieved by fully sampling k-space in timescales on the order of milliseconds. Moreover, by utilizing a Cartesian sampling trajectory, reconstruction and post-processing can be simplified compared to existing MRF applications, including by avoiding artifacts associated with regridding-based reconstructions.

Referring now to FIG. 1, a flowchart is illustrated as setting forth the steps of one non-limiting example method for estimating quantitative parameters (e.g., $T_1$, $T_2$, $B_0$, and proton density, $\rho$) from data acquired using acquisition parameters that have been selected to reduce the number of acquisitions necessary to desirably sample the quantitative parameter space. The method begins by generating a vector, or trajectory, of acquisition parameters that has been selected (or, as a non-limiting example, optimized) to reduce the number of acquisitions necessary to sufficiently sample the quantitative parameter space, as indicated at step 102.

By way of example, the selection or optimization of acquisition parameters, such as FA and TR, may include providing an initial, randomly-generated seed vector of the acquisition parameters to be selected or optimized. This seed vector may have a length, N, and be used to simulate the signal for a range, P, of quantitative parameters. For simplicity, this non-limiting example describes a $T_1$ mapping application, in which only a range, P, of $T_1$ values is simulated; however, it will be appreciated that other tissue parameters (e.g., $T_2$, proton density, off-resonance) can similarly be simulated. The seed vector and simulated quantitative parameters are used to form an N×P matrix, A. This matrix, A, can then be used to calculate a dot product matrix, $$D = A^T A \qquad (1).$$

The diagonal elements of this dot product matrix, D, indicate the closeness of a match between a trajectory resulting from a given quantitative parameter (e.g., $T_1$) and itself. The diagonal elements are, therefore, equal to one. The off-diagonal elements of the dot product matrix, D, however, indicate the quality of matching between every two different elements of the matrix, A. Discriminating between $T_1$ values in the matching process requires that the dot product of a measured trajectory with the pre-computed trajectory that is stored in the dictionary be high for the correct $T_1$ value and, ideally, zero for all others. To find the vector of acquisition parameters (e.g., TRs and FAs) that yield this optimum or a value that is sufficiently desirable, an model can be utilized. One non-limiting model is the following optimization problem:

$$\min_x f(x) \text{ such that } \sum_{i \neq j} D_{ij}(x) - \lambda \sum_{i=j} D_{ij}(x); \qquad (2a)$$

where f(x) is the function to simulate the trajectories and compute the dot product matrix, D, given a vector, x, of acquisition parameters. A penalty term, $\lambda$, is applied as well to avoid minimizing the on-diagonal elements. Another non-limiting example is:

$$\min_x f(x) = \left( \sum_{i \neq j} D(x)_{ij} \bigg/ \sum_{i=j} D(x)_{ij} \right); \qquad (2b)$$

where the ratio of off-diagonal to diagonal elements is minimized. As one example, a constrained non-linear solver can be used to solve Eqns. (2a) and (2b).

Figure 2:
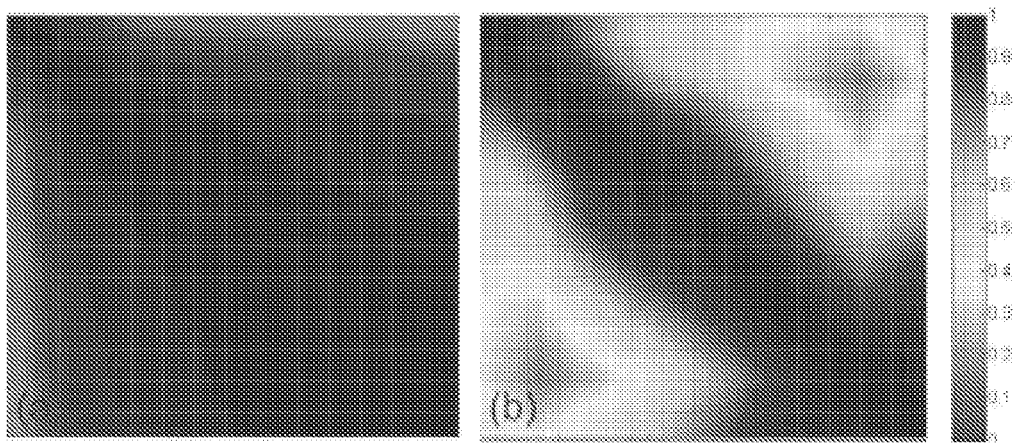
FIG. 2(a) illustrates an example of a dot product matrix for unoptimized acquisition parameters.
FIG. 2(b) illustrates an example of a dot product matrix for acquisition parameters created in accordance with the present disclosure.

In one example, the optimization was performed for N=10 acquisitions over a range of $T_1 \in [1,2000]$ ms. The resulting un-optimized and optimized dot product matrices are shown in FIGS. 2(*a*) and 2(*b*), respectively. The optimized trajectory yields a dot product matrix that is more diagonal, implying better selectivity and consequently better matching.

Referring again to FIG. 1, the method for estimating quantitative parameters continues by acquiring data by directing an MRI system to perform pulse sequences using the optimized acquisition parameters, as indicated at step 104. The pulse sequence can be any suitable pulse sequence for obtaining MRF data, but in some embodiments the pulse sequence used can be an EPI pulse sequence, which may be a spin-echo ("SE") EPI sequence or a gradient-recalled echo ("GRE") EPI sequence.

Using an EPI pulse sequence has the added benefit that k-space can be fully sampled in rapid fashion, which reduces the total number of acquisitions required overall. Reducing the total number of acquisitions not only provides a time saving measure, but also reduces the computational burden of matching the acquired data to a pre-computed dictionary because a smaller dictionary can be used with the reduced number of acquisitions. As mentioned above, although the EPI pulse sequence allow greater signal evolutions that previously MRF acquisitions, it is a discovery that these greater signal evolutions do not significantly reduce the accuracy or repeatability of the matching procedure.

Figure 3:
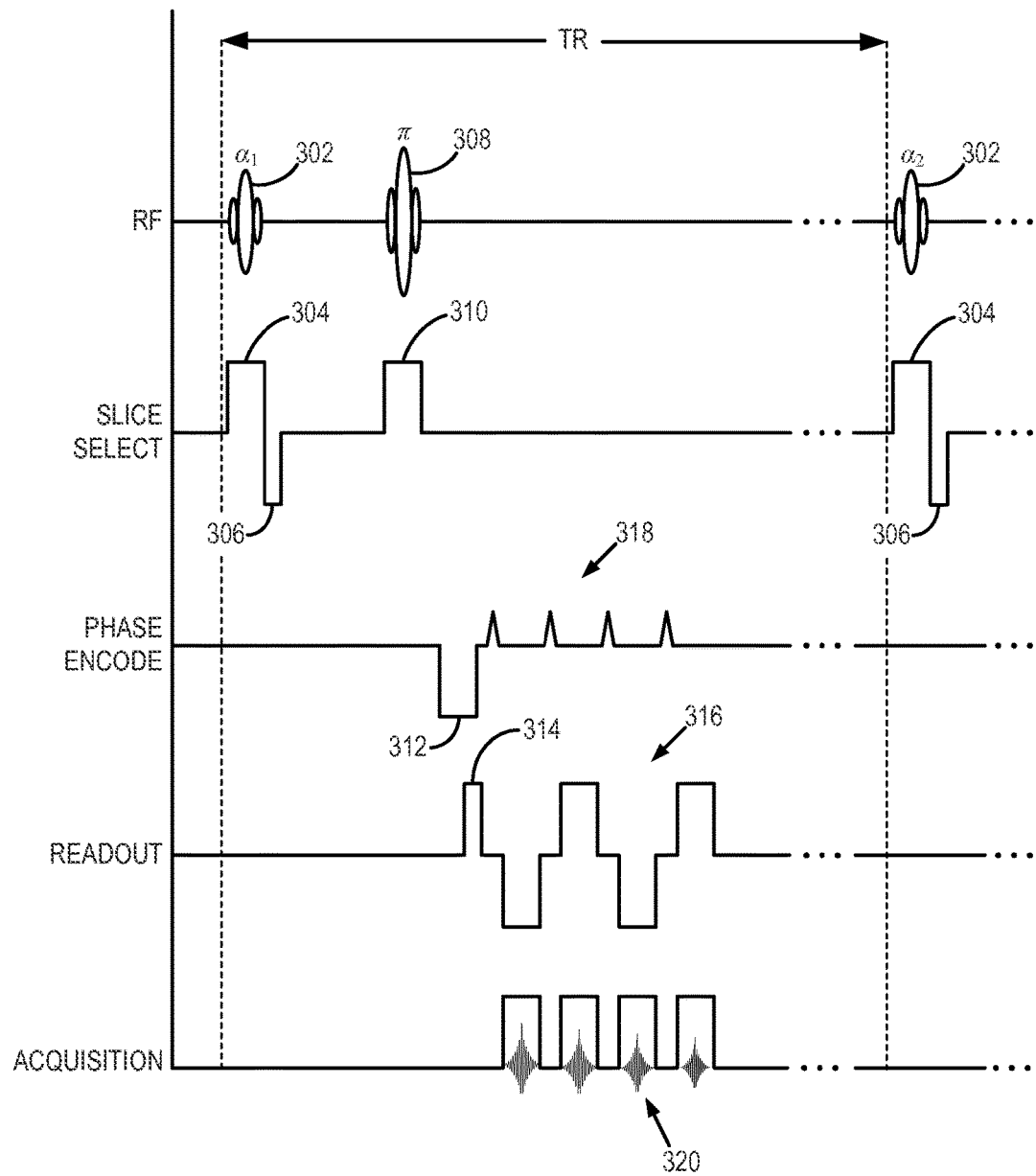
FIG. 3 is an example echo-planar imaging ("EPI") pulse sequence which may be used in accordance with the present disclosure.

Referring specifically now to FIG. 3, an example pulse sequence diagram of a modified spin-echo EPI technique for use in accordance with the MRF approach of the present disclosure, is shown. Specifically, for each TR, a selective RF excitation pulse 302 is played out in the presence of a slice select $G_z$ gradient pulse 304. In general spin-echo EPI sequences, the flip angle, $\alpha$, values of the RF excitations are usually 90 degrees to maximize the signal to noise ratio ("SNR"). By contrast, the present disclosure employs a variable FA, $\alpha$, that may be varied according to the optimized acquisition parameters, unlike previous MRF approaches that utilize pseudorandomized parameter values.

The slice select $G_z$ gradient pulse 304 is followed by a $G_z$ rephasing pulse 306, which operates to rephase excited spins in the selected slice. Subsequently, to facilitate the formation of spin echoes, the orientation of the transverse magnetization of excited spins may be reversed by application of a selective 180 degree RF excitation pulse 308 produced in the present of a slice select $G_z$ gradient pulse 310. Readout and phase-encoding waveforms are played following RF excitation to produce a series of spatially encoded gradient echoes. Specifically, following a phase encode pre-phase pulse 312 and readout pre-phase pulse 314 that determine a starting k-space sampling position, a plurality of gradient waveforms are played out for traversing k-space in accordance with a desired trajectory. In some configurations, this trajectory is a Cartesian k-space trajectory.

As shown in FIG. 3, following the pre-phase gradient pulse 314, a series of readout gradient pulses 318 with alternating polarity are played along the readout direction to produce a series of spin-echo signals 320. Specifically, the readout gradient pulses 316 are spaced apart, and phase-encoding gradient blips 318 are played out therebetween to separately phase encode each acquired echo 320. In particular, there is a separate readout gradient pulse 318 and phase-encoding gradient blip 318 for each view of k-space that is to be acquired. In this manner, multiple views may be acquired for each excitation in the TR, to encompass either k-space segments or fully sample k-space in accordance with the Nyquist criterion. Advantageously, fully sampled k-space on a Cartesian grid avoids a regridding and simplifies the reconstruction process.

Depending on the duration of the TR, in accordance with aspects of the present disclosure, multiple slices may be acquired during each scan. For instance, delays associated with wait times necessary for magnetization recovery of successive phase encoding k-space lines may limit total scan times. Thus, in certain applications, these otherwise dead times may be utilized for acquisition of multiple slices to facilitate three-dimensional ("3D") data acquisition. For instance, in some embodiments, a segmented EPI sequence may also be used, depending on the desired resolution and tissue parameter values. For such acquisitions, a wait time, $\Delta T$, may be needed following each segment to ensure the initial magnetization is the same for all segments. During the wait time, additional slices can be acquired, for example, if 3D acquisition is desired. As such, after a last phase-encoding k-space line of a segment is acquired for a particular slice, additional k-space segments from other slices may be interleaved therein.

In the manner described, multiple acquisitions can be performed, wherein scan parameter values for each acquisition can vary from one excitation to the next. For example, ten acquisitions can take place in a manner described above, although other values are possible. In some aspects, TR, FA, and other parameter values may be varied in accordance with optimized or desired trajectories, such as those described above; in a random manner; or in a pseudorandom manner. The parameters can be varied sequentially, simultaneously, or in accordance with a differential sensitivity requirement for specific parameters of interest.

Referring again to FIG. 1, the method continues by reconstructing images from the acquired data, as indicated at step 106. When an EPI sequence that sampled k-space along a Cartesian trajectory is used to acquire the data, reconstruction can be achieved using a conventional Fourier transform-based reconstruction, which introduces another reduction in the computational burden compared to conventional MRF applications that require complex reconstruction techniques to reconstruct images from data acquired using non-Cartesian trajectories.

Quantitative parameters are then estimated by, for example, matching the reconstructed images to one or more pre-computed dictionaries, as indicated at step 108. Conventional matching algorithms can be used; however, in some configurations, an adaptive matching algorithm, such as the one described in U.S. Patent Application Ser. No. 62/025,268 and PCT Application No. PCT/US15/11948, which are herein incorporated by reference in their entirety, can also be used. Parameter maps can then be generated using the estimated quantitative parameters, as indicated at step 110.

Figure 4:
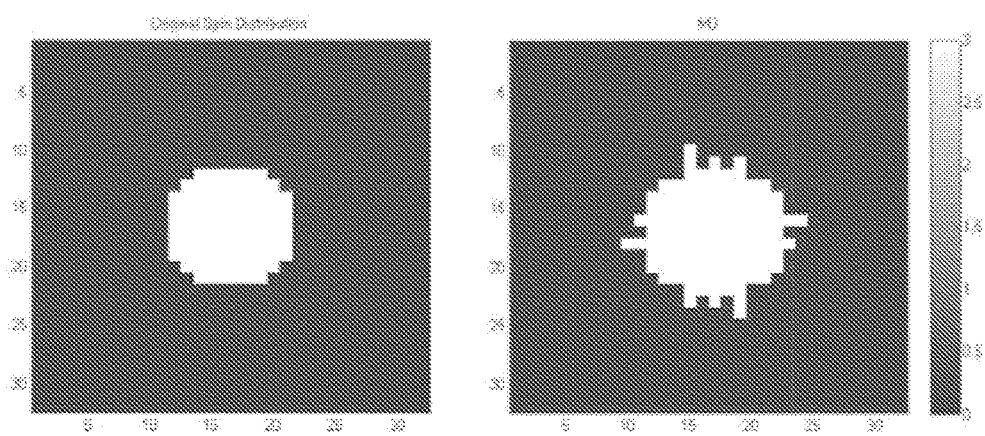
FIG. 4 illustrates examples of phantom and reconstructed spin distributions.

By way of example, ten acquisitions were simulated using optimized FA and TR parameter values using a spherical phantom. An adaptive matching algorithm was then applied to the simulated phantom data to obtain the tissue parameters of interest. A matrix size of 32×32 was used with a simulated field-of-view of 400×400 mm. The receiver bandwidth was 390 Hz/pixel and the total simulated scan time was about three seconds. The original phantom spin distribution and the reconstructed spin distribution are shown in FIG. 4, where reconstruction errors can be minimized with increased number of acquisitions.

Figure 5:
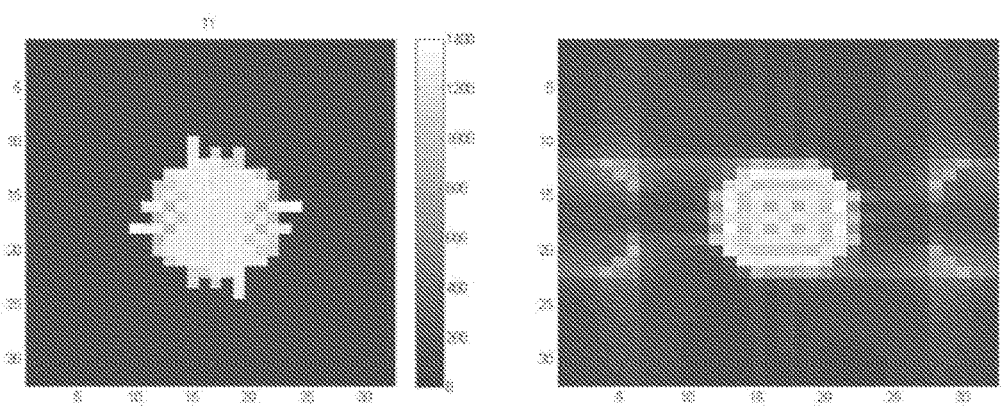
FIG. 5 illustrates examples of $T_1$ maps estimated using techniques described herein.

Referring to FIG. 5, an example reconstructed $T_1$ parameter map is shown. For simplicity, only $T_1$ maps obtained via simulation are shown, although as will be apparent to one skilled in the art, extension to other tissue parameters of interest does not require longer scan times and is considered within the scope of the present disclosure. In addition, a single acquired image of the phantom is also shown in FIG. 5 to demonstrate the presence of Nyquist ghosting artifacts typical to EPI acquisitions schemes. As may be appreciated, the reconstruction approach utilized herein removes such artifacts despite a lack of calibration scans or phase correction processing when the aliasing doesn't impinge on the object since in that case normalizing the measured signal accounts for the signal loss. We can then mask the image to remove the ghosts then reconstruct. The average $T_1$ value obtained by the matching process was about 1250 milliseconds, whereas the phantom "true" $T_1$ value was 1200 ms, representing an error of roughly four percent. As such, the present disclosure demonstrates a MR fingerprinting method that allows acquisition of relevant tissue parameters in 3D, and in minimal scan times.

Figure 6:
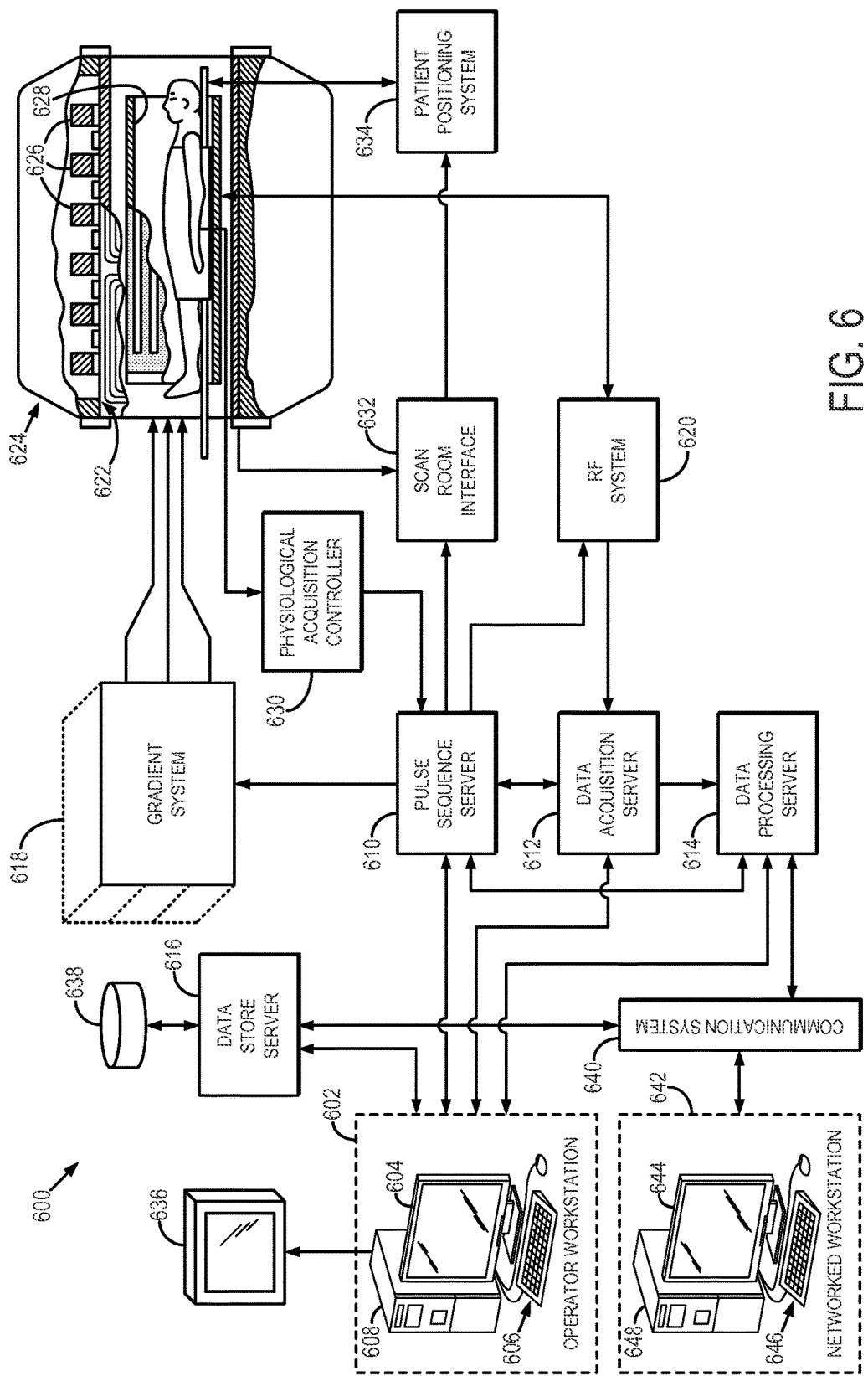
FIG. 6 is a block diagram of an example of a magnetic resonance imaging ("MRI") system for use in accordance with the present disclosure.

Referring particularly now to FIG. 6, an example of a magnetic resonance imaging ("MRI") system 600, for use in accordance with the present disclosure, is illustrated. The MRI system 600 includes an operator workstation 602, which will typically include a display 604; one or more input devices 606, such as a keyboard and mouse; and a processor 608. The processor 608 may include a commercially available programmable machine running a commercially available operating system. The operator workstation 602 provides the operator interface that enables scan prescriptions to be entered into the MRI system 600. In general, the operator workstation 602 may be coupled to four servers: a pulse sequence server 610; a data acquisition server 612; a data processing server 614; and a data store server 616. The operator workstation 602 and each server 610, 612, 614, and 616 are connected to communicate with each other. For example, the servers 610, 612, 614, and 616 may be connected via a communication system 640, which may include any suitable network connection, whether wired, wireless, or a combination of both. As an example, the communication system 640 may include both proprietary or dedicated networks, as well as open networks, such as the internet.

The pulse sequence server 610 functions in response to instructions downloaded from the operator workstation 602 to operate a gradient system 618 and a radiofrequency ("RF") system 620. Gradient waveforms necessary to perform the prescribed scan are produced and applied to the gradient system 618, which excites gradient coils in an assembly 622 to produce the magnetic field gradients $G_x$, $G_y$, and $G_z$ used for position encoding magnetic resonance signals. The gradient coil assembly 622 forms part of a magnet assembly 624 that includes a polarizing magnet 626 and a whole-body RF coil 628.

RF waveforms are applied by the RF system 620 to the RF coil 628, or a separate local coil (not shown in FIG. 6), in order to perform the prescribed magnetic resonance pulse sequence. Responsive magnetic resonance signals detected by the RF coil 628, or a separate local coil (not shown in FIG. 6), are received by the RF system 620, where they are amplified, demodulated, filtered, and digitized under direction of commands produced by the pulse sequence server 610. The RF system 620 includes an RF transmitter for producing a wide variety of RF pulses used in MRI pulse sequences. The RF transmitter is responsive to the scan prescription and direction from the pulse sequence server 610 to produce RF pulses of the desired frequency, phase, and pulse amplitude waveform. The generated RF pulses may be applied to the whole-body RF coil 628 or to one or more local coils or coil arrays (not shown in FIG. 6).

The RF system 620 also includes one or more RF receiver channels. Each RF receiver channel includes an RF preamplifier that amplifies the magnetic resonance signal received by the coil 628 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad (2);$$

and the phase of the received magnetic resonance signal may also be determined according to the following relationship:

$$\varphi = \tan^{-1}\left(\frac{Q}{I}\right). \qquad (3)$$

The pulse sequence server 610 also optionally receives patient data from a physiological acquisition controller 630. By way of example, the physiological acquisition controller 630 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 610 to synchronize, or "gate," the performance of the scan with the subject's heart beat or respiration.

The pulse sequence server 610 also connects to a scan room interface circuit 632 that receives signals from various sensors associated with the condition of the patient and the magnet system. It is also through the scan room interface circuit 632 that a patient positioning system 634 receives commands to move the patient to desired positions during the scan.

The digitized magnetic resonance signal samples produced by the RF system 620 are received by the data acquisition server 612. The data acquisition server 612 operates in response to instructions downloaded from the operator workstation 602 to receive the real-time magnetic resonance data and provide buffer storage, such that no data is lost by data overrun. In some scans, the data acquisition server 612 does little more than pass the acquired magnetic resonance data to the data processor server 614. However, in scans that require information derived from acquired magnetic resonance data to control the further performance of the scan, the data acquisition server 612 is programmed to produce such information and convey it to the pulse sequence server 610. For example, during prescans, magnetic resonance data is acquired and used to calibrate the pulse sequence performed by the pulse sequence server 610. As another example, navigator signals may be acquired and used to adjust the operating parameters of the RF system 620 or the gradient system 618, or to control the view order in which k-space is sampled. In still another example, the data acquisition server 612 may also be employed to process magnetic resonance signals used to detect the arrival of a contrast agent in a magnetic resonance angiography ("MRA") scan. By way of example, the data acquisition server 612 acquires magnetic resonance data and processes it in real-time to produce information that is used to control the scan.

The data processing server 614 receives magnetic resonance data from the data acquisition server 612 and processes it in accordance with instructions downloaded from the operator workstation 602. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 614 are conveyed back to the operator workstation 602 where they are stored. Real-time images are stored in a data base memory cache (not shown in FIG. 6), from which they may be output to operator display 612 or a display 636 that is located near the magnet assembly 624 for use by attending physicians. Batch mode images or selected real time images are stored in a host database on disc storage 638. When such images have been reconstructed and transferred to storage, the data processing server 614 notifies the data store server 616 on the operator workstation 602. The operator workstation 602 may be used by an operator to archive the images, produce films, or send the images via a network to other facilities.

The MRI system 600 may also include one or more networked workstations 642. By way of example, a networked workstation 642 may include a display 644; one or more input devices 646, such as a keyboard and mouse; and a processor 648. The networked workstation 642 may be located within the same facility as the operator workstation 602, or in a different facility, such as a different healthcare institution or clinic.

The networked workstation 642, whether within the same facility or in a different facility as the operator workstation 602, may gain remote access to the data processing server 614 or data store server 616 via the communication system 640. Accordingly, multiple networked workstations 642 may have access to the data processing server 614 and the data store server 616. In this manner, magnetic resonance data, reconstructed images, or other data may exchanged between the data processing server 614 or the data store server 616 and the networked workstations 642, such that the data or images may be remotely processed by a networked workstation 642. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for estimating quantitative parameters of a subject using a magnetic resonance imaging (MRI) system, the steps of the method comprising:
   (a) estimating acquisition parameters that are optimized to direct an MRI system to generate a plurality of different signal evolutions that maximize discrimination between different quantitative parameters in a minimized number of repetition time (TR) periods; wherein estimating the acquisition parameters includes minimizing an objective function that simulates the acquisition parameters and computing a matrix that is based on estimated values of the acquisition parameters and the quantitative parameters to be estimated;
   (b) acquiring data with the MRI system by directing the MRI system with a gradient system and a radio frequency (RF) system to perform a plurality of pulse sequences using the optimized acquisition parameters, the acquired data representing the plurality of different signal evolutions that maximize discrimination between different quantitative parameters; and (c) estimating quantitative parameters of the subject by comparing the acquired data with a dictionary database comprising a plurality of different signal templates.

2. The method as recited in claim 1, wherein step (a) includes selecting initial estimates of the acquisition parameters and forming the matrix based on the initial estimates.

3. The method as recited in claim 2, wherein the initial estimates of the acquisition parameters are selected by randomly generating values for the acquisition parameters.

4. The method as recited in claim 1, wherein the matrix comprises a first matrix that defines a dot product between a second matrix and a transpose of the second matrix, wherein the second matrix includes estimates of the acquisition parameters and simulated values for the quantitative parameters.

5. The method as recited in claim 1, wherein the objective function is minimized by searching for the acquisition parameters that minimize a difference between a sum of off-diagonal elements of the matrix and a sum of on-diagonal elements of the matrix.

6. The method as recited in claim 5, wherein the sum of on diagonal elements of the matrix is weighted by a penalty term to avoid minimizing the on-diagonal elements.

7. The method as recited in claim 1, wherein the plurality of pulse sequences performed in step (b) are echo-planar imaging (EPI) pulse sequences.

8. The method as recited in claim 7, wherein each EPI pulse sequence samples k-space in satisfaction of a Nyquist criterion.

9. The method as recited in claim 8, wherein each EPI pulse sequence sampling k-space along a Cartesian trajectory.

10. The method as recited in claim 7, wherein the EPI pulse sequences are segmented EPI pulse sequences that each sample less than a full extent of k-space.

11. The method as recited in claim 7, wherein each EPI pulse sequence is a spin-echo EPI pulse sequence.

12. The method as recited in claim 1, wherein step (c) includes reconstructing images from the acquired data and comparing the reconstructed images to the dictionary database.

13. A method for estimating quantitative parameters of a subject using a magnetic resonance imaging (MRI) system, the steps of the method comprising:
(a) acquiring data with the MRI system by directing the MRI system with a gradient system and a radio frequency (RF) system to perform an echo-planar imaging (EPI) pulse sequence that samples k-space in during each of a plurality of different repetition time (TR) periods, the acquired data representing a plurality of different signal evolutions acquired using different acquisition parameter settings in each TR period; and
(b) estimating quantitative parameters of the subject by minimizing an objective function that simulates the acquisition parameter, computing a matrix that is based on estimated values of the acquisition parameters and the quantitative parameters to be estimated and comparing the acquired data with a dictionary database comprising a plurality of different signal templates.

14. The method as recited in claim 13, wherein the EPI pulse sequence samples k-space along a Cartesian trajectory.

15. The method as recited in claim 13, wherein the EPI pulse sequence is a spin-echo EPI pulse sequence.

16. The method as recited in claim 13, further comprising estimating acquisition parameter settings that are optimized to direct the MRI system to generate different signal evolutions that maximize discrimination between different quantitative parameters in the plurality of different TR periods.

17. A magnetic resonance imaging (MRI) system, comprising:
a magnet system configured to generate a polarizing magnetic field about at least a portion of a subject arranged in the MRI system;
a magnetic gradient system including a plurality of magnetic gradient coils configured to apply at least one magnetic gradient field to the polarizing magnetic field;
a radio frequency (RF) system configured to apply an RF field to the subject and to receive magnetic resonance signals from the subject using a coil array;
a computer system programmed to:
estimate acquisition parameters to generate a plurality of different signal evolutions that achieve a desired discrimination between different quantitative parameters in a desired number of repetition time (TR) periods; wherein estimating the acquisition parameters includes minimizing an objective function that simulates the acquisition parameters and computing a matrix that is based on estimated values of the acquisition parameters and the quantitative parameters to be estimated;
control the magnetic gradient system and the RF system to acquire data using the estimated acquisition parameters, the data representing the plurality of different signal evolutions that achieve a desired discrimination between different quantitative parameters; and
estimate quantitative parameters of the subject by comparing the acquired data with a dictionary database comprising a plurality of different signal templates.

18. The system as recited in claim 17, wherein the computer system is configured to control the magnetic gradient system and the RF system to acquire the data by performing an echo-planar imaging (EPI) pulse sequence that samples k-space in satisfaction of a Nyquist criterion during each of a plurality of different repetition time (TR) periods.

19. The system of claim 17, wherein the computer system is configured to determine optimized acquisition parameters such that the data representing the plurality of different signal evolutions maximizes discrimination between different quantitative parameters.

* * * * *

UNITED STATES PATENT AND TRADEMARK OFFICE
CERTIFICATE OF CORRECTION

PATENT NO. : 10,261,155 B2
APPLICATION NO. : 15/117337
DATED : April 16, 2019
INVENTOR(S) : Ouri Cohen Page 1 of 1

It is certified that error appears in the above-identified patent and that said Letters Patent is hereby corrected as shown below:

In the Specification

Column 5, Line 54, Eq. (2b), " $\min_x f(x) = \left( \sum_{i \neq j} D(x)_{ij} / \sum_{i=j} D(x)_{ij} \right)$ " should be -- $\min_x f(x) = (\sum_{i \neq j} D(x)_{ij} / \sum_{i=j} D(x)_{ij})$ --.

In the Claims

Column 11, Claim 13, Line 55, "parameter" should be --parameters--.

Signed and Sealed this
Twenty-first Day of May, 2019

Andrei Iancu
*Director of the United States Patent and Trademark Office*